(12) United States Patent
Rollins

(10) Patent No.: US 8,948,301 B2
(45) Date of Patent: Feb. 3, 2015

(54) MULTI-BAND RADIO-FREQUENCY DIGITAL PREDISTORTION

(71) Applicant: Telefonaktiebolaget L M Ericsson (publ), Stockholm (SE)

(72) Inventor: Mark Edward Rollins, Stittsville (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/902,023

(22) Filed: May 24, 2013

(65) Prior Publication Data

US 2014/0348263 A1 Nov. 27, 2014

(51) Int. Cl.
*H04L 25/03* (2006.01)
*H04L 25/08* (2006.01)

(52) U.S. Cl.
CPC ................................ *H04L 25/08* (2013.01)
USPC ...... 375/296; 375/285; 455/114.3; 455/115.1

(58) Field of Classification Search
USPC .............. 330/278, 284, 291; 455/63.1, 67.11, 455/67.13, 114.2, 114.3, 115.1; 375/260, 375/267, 284, 285, 295–297, 299
See application file for complete search history.

(56) References Cited

U.S. PATENT DOCUMENTS

| | | | | |
|---|---|---|---|---|
| 5,892,397 | A * | 4/1999 | Belcher et al. | 330/149 |
| 7,026,873 | B2 * | 4/2006 | Shanbhag | 330/149 |
| 7,146,138 | B2 * | 12/2006 | Anvari | 455/114.3 |
| 7,183,847 | B2 * | 2/2007 | Suzuki et al. | 330/149 |
| 8,391,809 | B1 * | 3/2013 | Fuller | 455/114.3 |
| 2003/0179831 | A1 | 9/2003 | Gupta et al. | |
| 2009/0316838 | A1 | 12/2009 | Fuller et al. | |
| 2010/0098191 | A1 | 4/2010 | Morris et al. | |
| 2012/0128099 | A1 | 5/2012 | Morris et al. | |
| 2013/0064325 | A1 | 3/2013 | Kilambi et al. | |
| 2013/0243121 | A1 * | 9/2013 | Bai | 375/297 |
| 2014/0029683 | A1 * | 1/2014 | Morris et al. | 375/267 |

OTHER PUBLICATIONS

Author Unknown, "RF Predistortion (RFPD) vs. Digital Predistortion (DPD)," Scintera Networks, Copyright 2011, 4 pages, Retrieved from: www.scintera.com/technology/rf-predistortion-rfpd-vs-digital-predistortion-dpd/.

Rako, Paul, "RF Predistortion Straightens Out Your Signals," Analog Design Center, May 12, 2011, 8 pages, Retrieved from: http://www.edn.com/design/analog/4369663/RF-predistortion-straightens-out-your-signals.

(Continued)

*Primary Examiner* — Dac Ha
(74) *Attorney, Agent, or Firm* — Withrow & Terranova, PLLC

(57) ABSTRACT

Systems and methods for radio frequency digital predistortion in a multi-band transmitter are disclosed. In one embodiment, the multi-band transmitter includes a digital upconversion system configured to digitally upconvert digital input signals to provide digital radio frequency signals. Each digital input signal and thus each digital radio frequency signal corresponds to a different band of a multi-band transmit signal to be transmitted by the multi-band transmitter. The multi-band transmitter also includes a radio frequency digital predistortion system configured to digitally predistort the digital radio frequency signals to provide predistorted digital radio frequency signals, and a combiner configured to combine the predistorted digital radio frequency signals to provide a multi-band predistorted digital radio frequency signal.

22 Claims, 8 Drawing Sheets

(56) References Cited

OTHER PUBLICATIONS

Raz, Gil M. et al., "Baseband Volterra Filters for Implementing Carrier Based Nonlinearities," IEEE Transactions on Signal Processing, vol. 46, No. 1, Jan. 1998, pp. 103-114.
Sterling, Mark et al., "Direct Digital Predistortion on a Computer Controlled FPGS," IEEE International Conference on Acoustics, Speech and Signal Processing, vol. 2, Apr. 15-20, 2007, 4 pages.
Yi, Jaehyok et al., "Analog Predistortion Linearizer for High-Power RF Amplifiers," IEEE Transactions on Microwave Theory and Techniques, vol. 48, No. 12, Dec. 2000, pp. 2709-2713.
Bassam, Seyed Aidin et al., "Channel-Selective Multi-Cell Digital Predistorter for Multi-Carrier Transmitters," IEEE Transactions on Communications, vol. 60, No. 8, Aug. 2012, IEEE, pp. 2344-2352.
Choi, Sungho et al., "Design of Digital Predistorters for Wideband Power Amplifiers in Communication Systems with Dynamic Spectrum Allocation," IEEE International Conference on Acoustics, Speech and Signal Processing (ICASSP), May 22, 2011, IEEE, pp. 3204-3207.
International Search Report and Written Opinion for PCT/IB2014/061472, mailed Jul. 24, 2014, 14 pages.

* cited by examiner

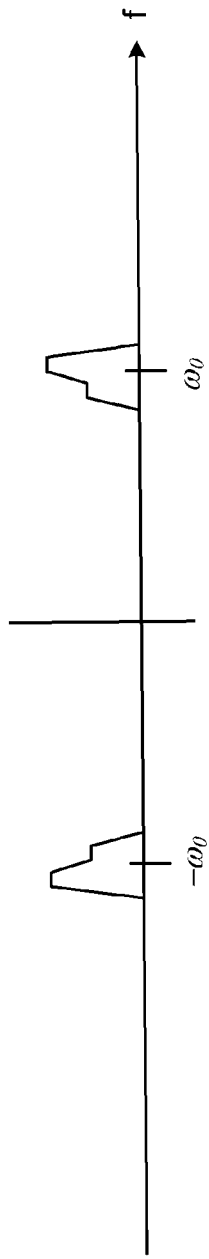
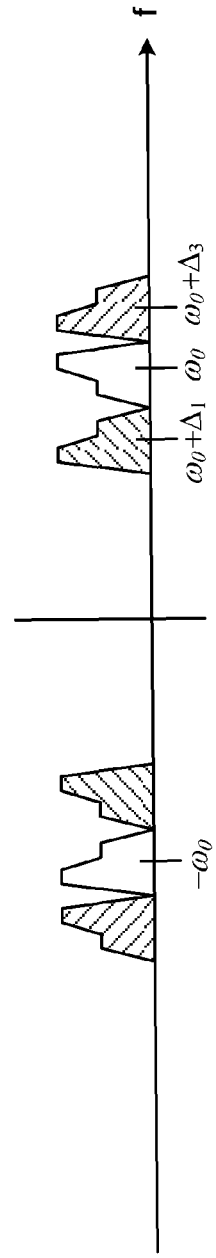
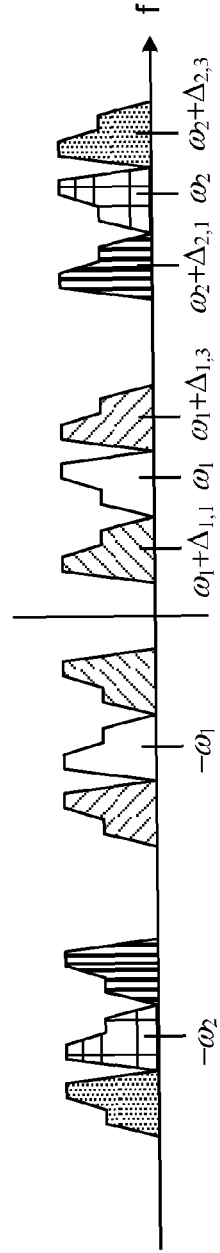

MULTI-BAND RADIO-FREQUENCY DIGITAL PREDISTORTION

FIELD OF THE DISCLOSURE

The present disclosure relates to digital predistortion and more specifically relates to digital predistortion in a multi-band transmitter.

BACKGROUND

Modern wireless communication systems employing wideband Power Amplifiers (PAs) must be operated close to saturation to maximize power efficiency. This introduces significant non-linear signal distortion to wideband signals such as Code Division Multiple Access (CDMA) and Orthogonal Frequency Division Multiplexing (OFDM) signals due to their large peak-to-average power ratio characteristics. Techniques to mitigate this non-linear distortion include:
  Backing off the PA operating point. However, doing so leads to larger size and cost to yield the same output power.
  Feed-forward cancellation of the non-linear distortion with analog combining networks. This is effective but incurs the additional cost of feed forward cancellation circuits and requires an additional low-power but highly linear Radio Frequency (RF) amplifier.
  Baseband Digital Predistortion (BB-DPD), which employs Digital Signal Processing (DSP) techniques to impress an "inverse characteristic" of the PA on the transmitted signal to compensate for the non-linear distortion introduced by the PA.
BB-DPD has become by far the preferred approach for managing PA nonlinearities.
Utilizing adaptive BB-DPD to compensate for the non-linearity of the PA is a proven technology that enables high linearity, high efficiency power PA sub-systems for single-band transmitters. However, in applications such as base stations of a cellular communications network that support multiple radio access technologies or multiple bands for the same radio access technology, multi-band transmitters are desirable. Conventional BB-DPD systems are not optimal for multi-band transmitters.

In order to address the complexity and power consumption of digital BB-DPD, RF Analog Predistortion (RF-APD) for single-band signals has been proposed by entities such as Scientera. RF-APD technology predistorts for non-linear distortion using analog delay cells and Gilbert cell multipliers. It is difficult to design these circuit elements with sufficiently wide bandwidth to address multi-band signals, particularly those with a wide separation between individual bands. An academic example of RF-APD, Yi et. al., "Analog Predistortion Linearizer for High-Power RF Amplifiers," IEEE Transactions on Microwave Theory and Techniques, Vol. 48, No. 12, December 2000, illustrates the technical challenge of implementing RF-APD for a single-band signal of only 30 megahertz (MHz) bandwidth. Finally, analog circuits suffer from thermal, voltage, and semiconductor process variations that must be compensated for using sophisticated on-line calibration circuitry.

In addition, an academic example of digital predistortion at RF for a single-band signal is described in Mark Sterling et al., "Direct Digital Predistortion on a Computer Controlled FPGA," IEEE International Conference on Acoustics, Speech and Signal Processing, 2007, Vol. 2, pp. II-369, II-372, Apr. 15-20, 2007. Here, the real-valued digital RF signal is predistorted by passing it through the following digital operations: a cubic non-linearity (implemented as a lookup table) followed by a gain adjustment followed by a time delay. This method makes no attempt to manage the digital aliasing of third order terms generated from cubing the single-band signal. Managing this aliasing becomes infeasible for multi-band signals whose third order distortion products can alias into signal bands of interest within the active Nyquist zone.

As such, there is a need for systems and methods for digital predistortion in a multi-band transmitter.

SUMMARY

Systems and methods for Radio Frequency Digital Predistortion (RF-DPD) in a multi-band transmitter are disclosed. In one embodiment, the multi-band transmitter includes a digital upconversion system configured to digitally upconvert digital input signals to provide digital radio frequency signals. Each digital input signal, and thus each digital radio frequency signal, corresponds to a different band of a multi-band transmit signal to be transmitted by the multi-band transmitter. The multi-band transmitter also includes a RF-DPD system configured to digitally predistort the digital radio frequency signals at radio frequency to provide predistorted digital radio frequency signals, and a combiner configured to combine the predistorted digital radio frequency signals to provide a multi-band predistorted digital radio frequency signal. By performing digital predistortion at radio frequency, sampling rates required for digital upconversion of each of the digital input signals is substantially reduced as compared to a similar system in which digital predistortion is performed at baseband prior to digital upconversion. In addition, complexity of the digital upconversion is reduced in that there is no need to digitally upconvert inter-band distortion products as needed in a similar system that utilizes baseband digital predistortion.

In one embodiment, the multi-band transmitter further includes a multi-band signal processing system configured to process the multi-band predistorted digital radio frequency signal to provide a multi-band predistorted analog radio frequency signal and Power Amplifier (PA) circuitry configured to amplify the multi-band predistorted analog radio frequency signal to provide the multi-band transmit signal. In one embodiment, the multi-band predistorted digital radio frequency signal is a complex signal, and the multi-band signal processing system includes circuitry configured to receive the multi-band predistorted digital radio frequency signal and output a real part of the multi-band predistorted digital radio frequency signal, digital-to-analog conversion circuitry configured to convert the real part of the multi-band predistorted digital radio frequency signal to an analog signal, and filtering circuitry configured to filter the analog signal to provide the multi-band predistorted analog radio frequency signal. In another embodiment, the multi-band predistorted digital radio frequency signal is a real signal, and the multi-band signal processing system includes digital-to-analog conversion circuitry configured to convert the multi-band predistorted digital radio frequency signal to an analog signal and filtering circuitry configured to filter the analog signal to provide the multi-band predistorted analog radio frequency signal.

In one embodiment, the digital upconversion system includes a separate digital upconversion subsystem for each band of the multi-band transmit signal to be transmitted by the multi-band transmitter % in one embodiment, the RF-DPD system includes a separate RF-DPD subsystem for each band of the multi-band transmit signal to be transmitted by the multi-band transmitter. In one embodiment, for each band of the multi-band signal, the separate RF-DPD subsystem for the band is configured to directly synthesize desired intra-band and inter-band distortion products for the band based on the digital radio frequency signals to thereby provide a corresponding predistorted digital radio frequency signal for the band.

In one embodiment, the multi-band transmitter further includes a training system configured to train the RF-DPD system. In particular, in, one embodiment, the training system is configured, to train models utilized by the RF-DPD system to predistort the digital radio frequency signals. In one embodiment, the training system includes a separate training subsystem for each band of the multi-band transmit signal.

In one embodiment, a method of operation of a multi-band transmitter includes digitally upconverting digital input signals to provide digital radio frequency signals, where each digital input signal, and thus each digital radio frequency signal, corresponds to a different band of a multi-band transmit signal to be transmitted by the multi-band transmitter. The method further includes digitally predistorting the digital radio frequency signals at radio frequency to provide predistorted digital radio frequency signals, and combining the predistorted digital radio frequency signals to provide a multi-band predistorted digital radio frequency signal. In one embodiment, digitally predistorting the digital radio frequency signals includes directly synthesizing intra-band and inter-band distortion products.

In one embodiment, the method further includes processing the multi-band predistorted digital radio frequency signal to provide a multi-band predistorted analog radio frequency signal, and amplifying the multi-band predistorted analog radio frequency signal to provide the multi-band transmit signal.

In one embodiment, the multi-band predistorted digital radio frequency signal is a complex signal, and processing the multi-band predistorted digital radio frequency signal includes obtaining a real part of the multi-band predistorted digital radio frequency signal, converting the real part of the multi-band predistorted digital radio frequency signal from digital to analog to thereby provide a corresponding analog signal, and filtering the corresponding analog signal to thereby provide the multi-band predistorted analog radio frequency signal. In another embodiment, the multi-band predistorted digital radio frequency signal is a real signal, and processing the multi-band predistorted digital radio frequency signal includes converting the multi-band predistorted digital radio frequency signal from digital to analog to thereby provide a corresponding analog signal and filtering the corresponding analog signal to thereby provide the multi-band predistorted analog radio frequency signal.

In one embodiment, digitally upconverting the digital input signals includes separately digitally upconverting the digital input signals for each band of the multi-band transmit signal to be transmitted by the multi-band transmitter. In one embodiment, digitally predistorting the digital radio frequency signals includes separately digitally predistorting the digital radio frequency signals for each band of the multi-band transmit signal to be transmitted by the multi-band transmitter. Further, in one embodiment, separately digitally predistorting the digital radio frequency signals includes, for each band of the multi-band transmit signal, directly synthesizing desired intra-band and inter-band distortion products for the band based on the plurality of digital radio frequency signals to thereby provide a corresponding one of the plurality of predistorted digital radio frequency signals.

In one embodiment, the method further includes training models utilized for digitally predistorting the digital radio frequency signals. In one embodiment, training the models utilized for digitally predistorting the digital radio frequency signals includes separately training the models for corresponding bands of the multi-band transmit signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A through 2C illustrate a single-carrier signal, a single-band signal, and a multi-band signal, respectively.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
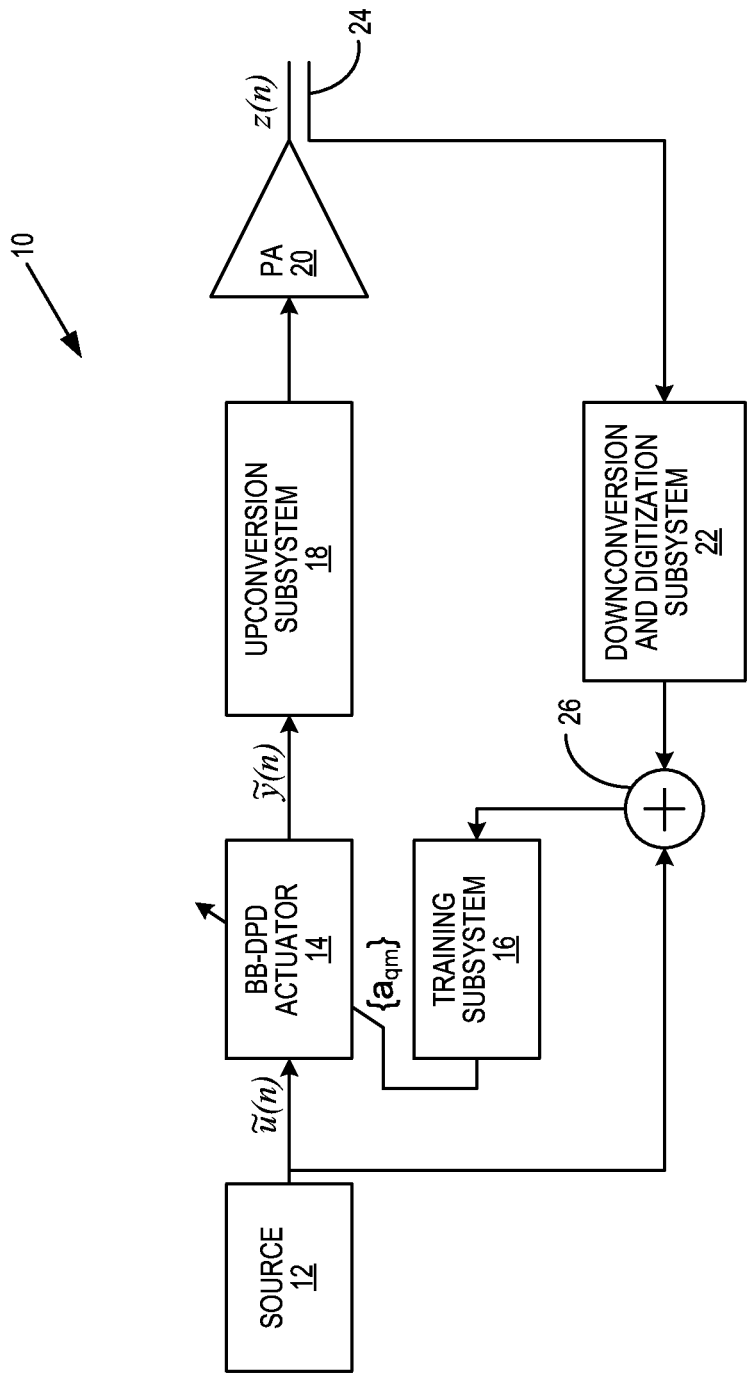
FIG. 1 illustrates a single-band transmitter utilizing conventional Baseband Digital Predistortion (BB-DPD)

Systems and methods for Radio Frequency Digital Predistortion (RF-DPD) in a multi-band transmitter are disclosed. Before discussing embodiments of a multi-band transmitter including RF-DPD, a discussion of conventional Baseband Digital Predistortion (BB-DPD) is beneficial. In this regard, FIG. 1 illustrates a transmitter 10 utilizing conventional BB-DPD. A complex-valued digital baseband signal ũ(n) from a source 12 is predistorted by a BB-DPD actuator 14 using complex-valued tap weights $\{a_{qm}\}$ computed by a training subsystem 16 to thereby provide a predistorted digital baseband signal ỹ(n). The predistorted digital baseband signal ỹ(n) is upconverted to radio frequency and Digital-to-Analog (D/A) converted by an upconversion subsystem 18 to thereby provide a predistorted radio frequency analog signal. In one implementation, the upconversion subsystem 18 includes digital upconversion circuitry that upconverts the predistorted digital baseband signal ỹ(n) in the digital domain followed by a wideband Radio Frequency (RF) Digital-to-Analog Converter (DAC) as described in U.S. Patent Application Publication No. 2010/0098191 A1, entitled METHODS AND SYSTEMS FOR PROGRAMMABLE DIGITAL UP-CONVERSION, filed on Oct. 20, 2008, and published on Apr. 22, 2010, which is hereby incorporated herein by reference in its entirety. The predistorted radio frequency analog signal is amplified by a Power Amplifier (PA) 20 to thereby provide a real-valued transmit signal z(n) at the output of the PA 20.

In general, the training subsystem 16 computes the tap weights $\{a_{qm}\}$, and thereby trains the BB-DPD actuator 14, such that the predistortion introduced by the BB-DPD actuator 14 compensates for non-linearity of the PA 20 (i.e., the predistortion is an inverse of distortion resulting from the non-linearity of the PA 20). More specifically, a downconversion and digitization subsystem 22, which can be referred to as a transmit observation receiver (TOR), receives the transmit signal z(n) from the output of the PA 20 via a coupler 24 and downconverts and digitizes the transmit signal z(n) to thereby provide a feedback signal that is representative of the transmit signal z(n). A combiner 26, or in this case a subtraction node, outputs an error signal that is equal to a difference between the digital baseband signal ũ(n) and the feedback signal. The training subsystem 16 uses a training procedure that observes the error signal and adaptively configures the tap weights $\{a_{qm}\}$ to minimize the error signal (i.e., to make the error signal zero).

Typically, the BB-DPD actuator 14 implements a predistortion function based on a Volterra representation of the non-linear system, or its simplified "Memory Polynomial" (MP) variant, since the tap weights $\{a_{qm}\}$ may be optimized by solving a linear system of equations. Equation 1 below shows how to compute the predistorted digital baseband signal ỹ(n) from the digital baseband input signal ũ(n) and the set of tap weights $\{a_{qm}\}$ for the MP based actuator. Typically, the BB-DPD actuator 14 includes a set Q={1,3,5} of non-linear terms in practice. Also, the BB-DPD actuator 14 may use M=0 for the case where the PA 20 response exhibits a memoryless non-linear characteristic, or some suitable non-zero value of M based on the worst-cast extent of the PA 20 memory otherwise.

$$\tilde{y}(n) = \sum_{q \in Q} \sum_{m=0}^{M} a_{qm} \cdot u(n-m) \cdot |u(n-m)|^{q-1} \qquad \text{Eqn.1}$$

Often in practice, the digital baseband signal ũ(n) is a complex-valued Code Division Multiple Access (CDMA) or Orthogonal Frequency Division Multiplexing (OFDM) signal on a single carrier in a single RF band, such that the real-valued transmit signal z(n) is given by z(n)=ℝ{exp (jω$_o$n)ũ(n)}. In this case, the transmitter 10 in FIG. 1 is referred to as a "single-carrier" system. The transmitted radio spectrum in this case is shown in FIG. 2A.

Alternately, the digital baseband input signal ũ(n) may consist of a set of multiple carriers transmitted in a contiguous set of carriers, or a "single-band" as shown in FIG. 2B. In this case, the real-valued transmit signal z(n) is given by Equation 2, where a total of S carriers are transmitted in the single-band centered at carrier frequency ω$_o$. Within that band, the carrier frequency for the s-th carrier is given by ω$_Q$+Δ$_S$.

$$z(n) = \mathbb{R}\{e^{j\omega_o n}\tilde{u}(n)\} = \mathbb{R}\left\{e^{j\omega_o n}\sum_{s=1}^{S}\tilde{u}_s(n)e^{j\Delta_s n}\right\} \qquad \text{Eqn. 2}$$

Finally, the digital baseband signal ũ(n) may consist of multiple disjoint sets of contiguous carriers transmitted in non-contiguous bands, or a "multi-band" scenario as shown in FIG. 2C. In this case, the real-valued transmit signal z(n) is given in Equation 3, where there are B bands, with s$_b$ carriers transmitted in the b-th signal band.

$$z(n) = \mathbb{R}\left\{\sum_{b=1}^{B}e^{j\omega_b n}\tilde{u}_b(n)\right\} = \mathbb{R}\left\{\sum_{b=1}^{B}e^{j\omega_b n}\sum_{s=1}^{S_b}\tilde{u}_{b,s}(n)e^{j\Delta_{b,s}n}\right\} \qquad \text{Eqn.3}$$

Figure 3:
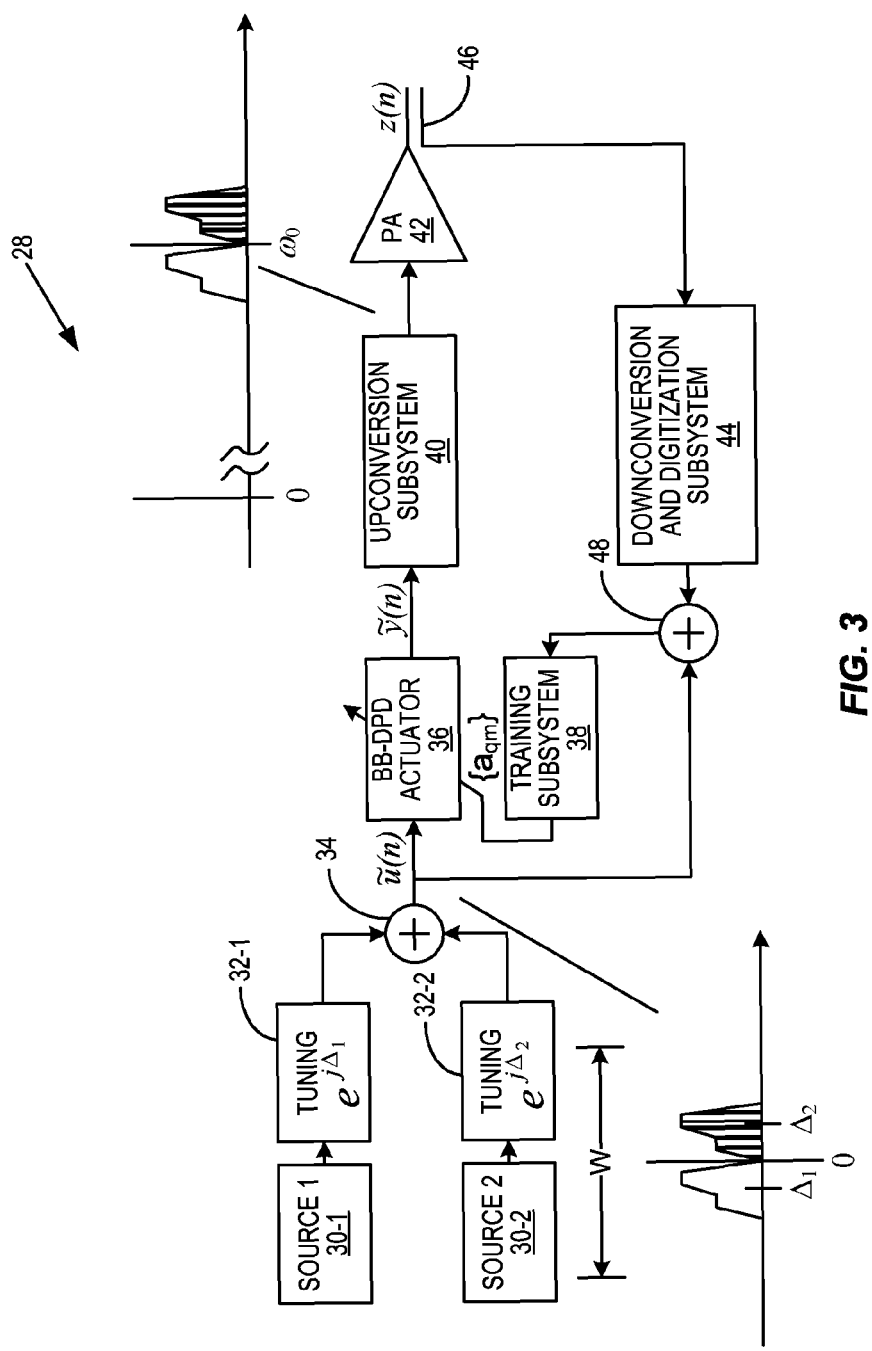
FIG. 3 illustrates a dual-carrier single-band transmitter utilizing conventional BB-DPD.

FIG. 3 is a block diagram of a transmitter 28 that implements BB-DPD for a multi-carrier, single-band system. In this example, there are two carriers. Here, two digital baseband signals from corresponding sources 30-1 and 30-2 are complex tuned to desired frequencies $\Delta_1$ and $\Delta_2$ by corresponding complex tuners 32-1 and 32-2. The complex tuned digital baseband signals are then combined by a combiner 34, or in this case a summation node, to provide a multiple-carrier, single-band digital baseband input signal ũ(n). From this point, the transmitter 28 operates in the same manner as described above with respect to the transmitter 10. Specifically, the digital baseband input signal ũ(n), which is complex-valued, is predistorted by a BB-DPD actuator 36 using complex-valued tap weights $\{a_{qm}\}$ computed by a training subsystem 38 to thereby provide a predistorted digital baseband signal ỹ(n). The predistorted digital baseband signal ỹ(n) is upconverted to radio frequency and D/A converted by an upconversion subsystem 40 to thereby provide a predistorted radio frequency analog signal. In one implementation, the upconversion subsystem 40 includes digital upconversion circuitry that upconverts the predistorted digital baseband signal ỹ(n) in the digital domain followed by a wideband RF DAC as described in U.S. Patent Application Publication No. 2010/0098191 A1. The predistorted radio frequency analog signal is amplified by a PA 42 to thereby provide a real-valued transmit signal z(n) at the output of the PA 42.

The training subsystem 38 computes the tap weights $\{a_{qm}\}$ and thereby trains the BB-DPD actuator 36 such that the predistortion introduced by the BB-DPD actuator 36 compensates for non-linearity of the PA 42 (i.e., the predistortion is an inverse of distortion resulting from the non-linearity of the PA 42). More specifically, a downconversion and digitization subsystem 44, which can be referred to as a TOR, receives the transmit signal z(n) from the output of the PA 42 via a coupler 46 and downconverts and digitizes the transmit signal z(n) to thereby provide a feedback signal that is representative of the transmit signal z(n). A combiner 48, or in this case a subtraction node, outputs an error signal that is equal to a difference between the digital baseband input signal ũ(n) and the feedback signal. The training subsystem 38 uses a training procedure that observes the error signal and adaptively configures the tap weights $\{a_{qm}\}$ to minimize the error signal (i.e., to make the error signal zero). In this way, Equation 1 above applies equally to a single carrier scenario and a multi-carrier scenario and, for the multi-carrier scenario, produces the correct distortion products provided that the multi-carrier spectrum is centered properly at baseband.

The predistorted digital baseband signal ỹ(n) for the multi-carrier, single-band system contains cross-products of the form $\tilde{u}_1(n-m)|\tilde{u}_2(n-m)|^{q-1}$ and $\tilde{u}_2(n-m)|\tilde{u}_1(n-m)|^{q-1}$ in addition to the self-products $\tilde{u}_1(n-m)|\tilde{u}_1(n-m)|^{q-1}$ and $\tilde{u}_2(n-m)|\tilde{u}_2(n-m)|^{q-1}$, as is necessary for effective predistortion. By operating on an output of the combiner 34 (i.e., by operating on the summed multiple carrier digital baseband input signal ũ(n), the BB-DPD actuator 36 generates these cross products automatically. Based on the non-linear products of Equation 1, the predistorted digital baseband signal ỹ(n) typically contains $3^{rd}$ and $5^{th}$ order distortion products. Given that the multiple carrier, single-band digital baseband input signal ũ(n) exhibits a bandwidth W as shown in FIG. 3, it follows that the BB-DPD actuator 36 must operate with a sampling rate of 5 W or higher. As a result, the bandwidth of the multiple carrier, single-band digital baseband input signal ũ(n) directly affects the computational complexity of the BB-DPD actuator 36, as well as that of the following upconversion subsystem 40 (especially for digital upconversion due to this high sampling rate).

Figure 4:
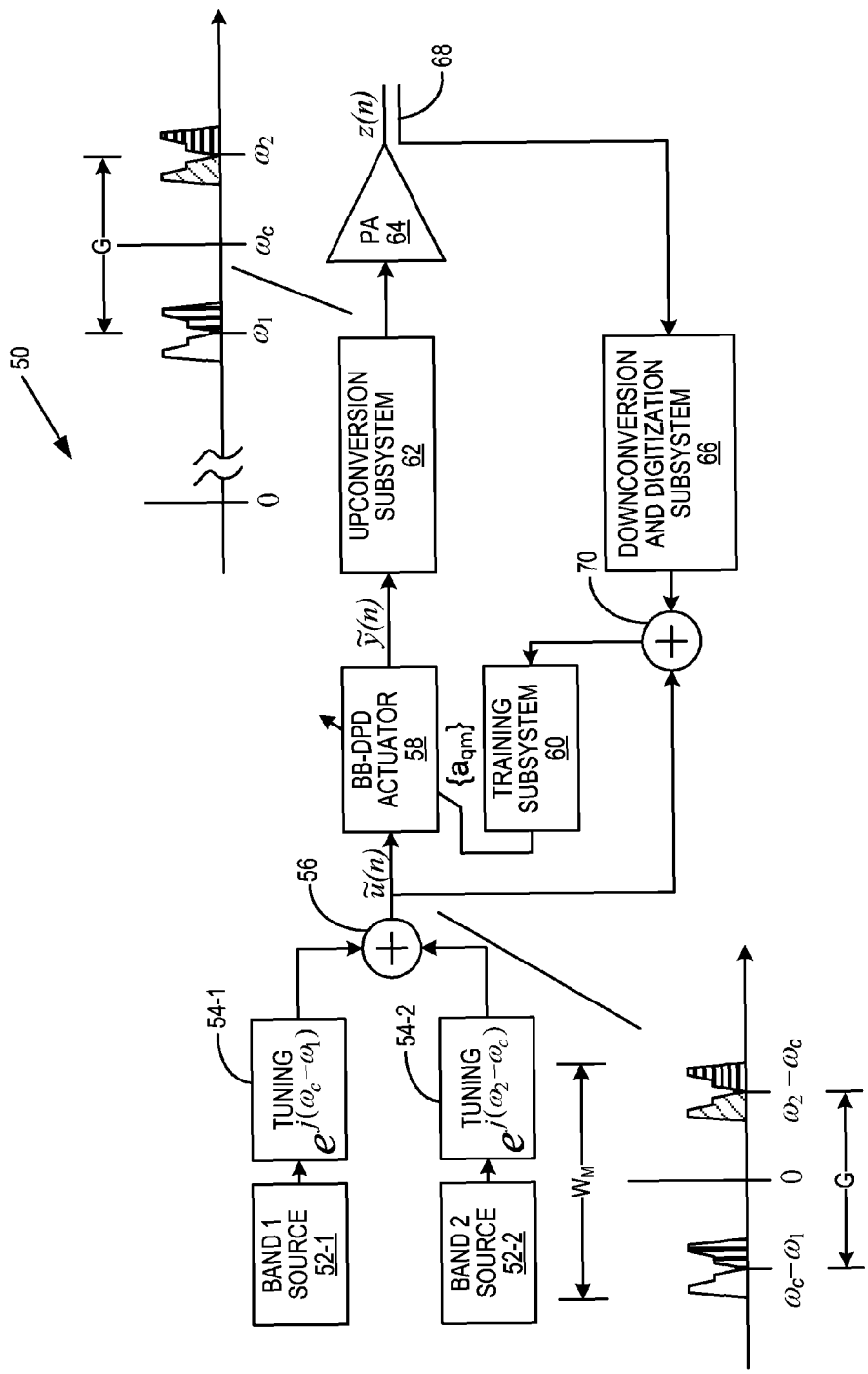
FIG. 4 illustrates a dual-carrier dual-band transmitter utilizing conventional BB-DPD.

FIG. 4 is a block diagram of a transmitter 50 that implements BB-DPD for a multi-carrier, multi-band system. In this example, there are two bands, each having two carriers. Here, each single-band component of the multi-band signal must be tuned to an intermediate frequency (IF) such that a resulting combined multi-band signal lies centered at baseband. In this way, Equation 1 applies equally to a multi-band scenario and a single-band scenario. More specifically, as illustrated, two multi-carrier digital baseband signals each having two carriers are provided by corresponding sources 52-1 and 52-2. The multi-carrier digital baseband signals are complex tuned to desired IF frequencies $\omega_e-\omega_1$ and $\omega_2-\omega_e$, respectively, by corresponding complex tuners 54-1 and 54-2. The complex-tuned multi-carrier digital baseband signals are then combined by a combiner 56, or in this case a summation node, to provide a multiple-carrier, multi-band digital baseband input signal ũ(n). From this point, the transmitter 50 operates in the same manner as described above with respect to the transmitters 10 and 28.

Specifically, the multiple carrier, multi-band digital baseband input signal ũ(n) which is complex-valued, is predistorted by a BB-DPD actuator 58 using complex-valued tap weights $\{a_{qm}\}$ computed by a training subsystem 60 to thereby provide a predistorted digital baseband signal ỹ(n). The predistorted digital baseband signal ỹ(n) is upconverted to radio frequency and D/A converted by an upconversion subsystem 62 to thereby provide a predistorted radio frequency analog signal. In one implementation, the upconversion subsystem 62 includes digital upconversion circuitry that upconverts the predistorted digital baseband signal ỹ(n) in the digital domain followed by a wideband RF DAC as described in U.S. Patent Application Publication No. 2010/0098191 A1. The predistorted radio frequency analog signal is amplified by a PA 64 to thereby provide a real-valued transmit signal z(n) at the output of the PA 64.

The training subsystem 60 computes the tap weights $\{a_{qm}\}$ and thereby trains the BB-DPD actuator 58 such that the predistortion introduced by the BB-DPD actuator 58 compensates for non-linearity of the PA 64 (i.e., the predistortion is an inverse of distortion resulting from the non-linearity of the PA 64). More specifically, a downconversion and digitization subsystem 66, which can be referred to as a TOR, receives the transmit signal z(n) from the output of the PA 64 via a coupler 68 and downconverts and digitizes the transmit signal z(n) to thereby provide a feedback signal that is representative of the transmit signal z(n). A combiner 70, or in this case a subtraction node, outputs an error signal that is equal to a difference between the digital baseband input signal ũ(n) and the feedback signal. The training subsystem 60 uses a training procedure that observes the error signal and adaptively configures the tap weights $\{a_{qm}\}$ to minimize the error signal (i.e., to make the error signal zero).

The predistorted digital baseband signal ỹ(n) contains several types of distortion products including self-products of the form $\tilde{u}_{1,1}(n-m)|\tilde{u}_{1,1}(n-m)|^{q-1}$, intra-band products of the form $\tilde{u}_{1,1}(n-m)|\tilde{u}_{1,2}(n-m)|^{q-1}$, and inter-band products of the form $\tilde{u}_{1,1}(n-m)|\tilde{u}_{2,2}(n-m)|^{q-1}$. By operating on the summed multi-band signal, the BB-DPD actuator 58 generates all of these cross products automatically. Based on the non-linear products of Equation 1, the predistorted digital baseband signal ỹ(n) typically contains $3^{rd}$ and $5^{th}$ order distortion products. Given the multiple carrier, multi-band digital baseband input signal ũ(n) exhibits a bandwidth $W_M$ as shown in FIG. 4, it follows that the BB-DPD actuator 58 must operate with a sampling rate of 5 $W_M$ or higher. Note that $W_M>>W$ due to the fact that each band contains multiple carriers, and there may be a large separation G in frequency between the bands.

Applying conventional BB-DPD concepts to multi-band systems produces radio architectures with computational complexity that is prohibitive to implement. This complexity occurs due to the large distortion bandwidths that result with multi-band signals of interest and the wide separations in frequency that may exist between bands of interest. More specifically, multi-band signals exhibit a large bandwidth $W_M$ requiring distortion bandwidths on the order of 5 $W_M$ or higher. Assuming that the upconversion subsystem 62 is performed by digital upconversion circuitry followed by a RF DAC as described in U.S. Patent Application Publication No. 2010/0098191 A1, it follows that the minimum sampling rate of all data path operations in the digital upconversion circuitry must also be 5 $W_M$ or higher if the BB-DPD actuator 58 is implemented at baseband prior to digital upconversion. Certain variants of BB-DPD can be conceived to reduce this impact. For example, architectures in which the $1^{st}$, $3^{rd}$, and $5^{th}$ order distortion products of Equation 1 are upconverted separately and then summed at RF would require lower minimum sampling rates (at least for the $1^{st}$ and $3^{rd}$ order cases). However, this solution would entail building at least three parallel digital upconversion data paths, where one of the data paths still requires the 5 $W_M$ or higher sampling rate.

In addition, multi-band signals may exhibit a large separation in frequency between bands as (shown as G in FIG. 4). So, even though the actual signal bandwidth of the occupied carriers may be modest, a large separation G results in a large overall bandwidth $W_M$ and, therefore, a large sampling rate of 5 $W_M$ or higher is required for the digital upconversion. Again, alternative variants of BB-DPD can be conceived to reduce this impact. For systems with a large separation G, it is possible to form the required distortion self-products and intra-band products for each band in isolation directly from a separate BB-DPD actuator driven by the input signal for that band. The system must then provision additional BB-DPD actuators to produce the inter-band distortion products for the multi-band scenario. This solution helps to reduce the complexity of the digital upconversion circuitry since each branch of the digital upconversion circuitry requires a sampling rate of 5 W (the worst-case bandwidth of a single-band) instead of 5 $W_M$. However, the solution requires additional parallel Digital Radio Frequency (DRF) upconversion data paths to position the inter-band distortion products at the correct carrier frequency. For a multi-band scenario with several disjoint bands, the complexity of these additional digital upconversion paths quickly becomes prohibitive.

Systems and methods are disclosed herein for addressing the complexity burden of BB-DPD for multi-band signals. In particular, in one embodiment, a transmitter implements Radio Frequency Digital Predistortion (RF-DPD). In this embodiment, DPD is applied directly to a digital RF signal after digital upconversion (referred to herein as DRF upconversion) before D/A conversion. With predistortion performed at RF, the minimal sampling rate required for DRF upconversion is substantially reduced as compared to the multi-carrier, multi-band BB-DPD scenario discussed above. In addition, there is no need for additional DRF upconversion data paths to upconvert inter-band distortion products as is needed with the multi-carrier, multi-band BB-DPD scenario discussed above. In addition, desired intra-band and inter-band distortion products can be computed explicitly by separate RF-DPD actuators for each band of the multi-band signal.

Figure 5:
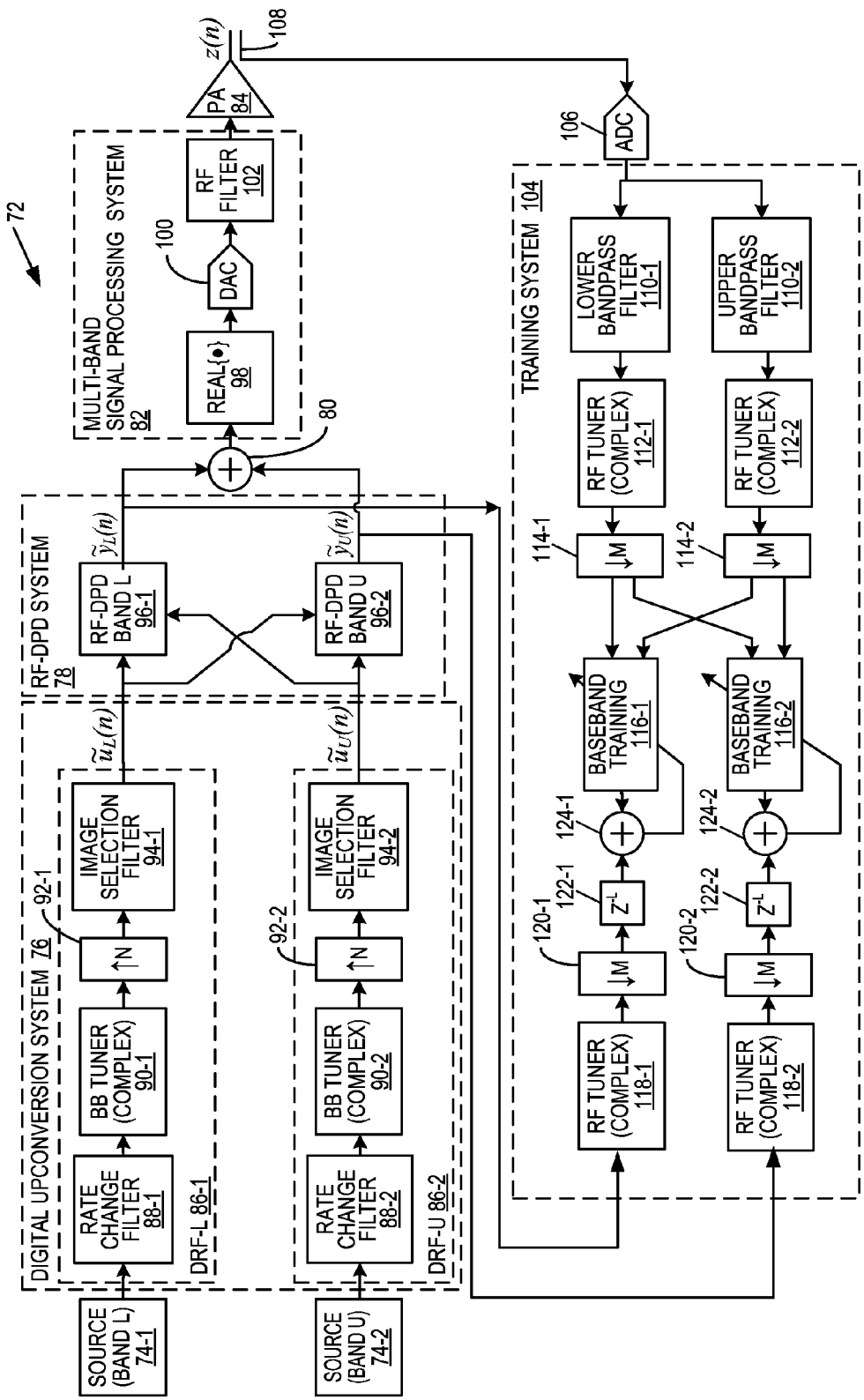
FIG. 5 illustrates a dual-band transmitter including Radio Frequency Digital Predistortion (RF-DPD) according to one embodiment of the present disclosure.

In this regard, FIG. 5 illustrates a transmitter 72 that implements RE-DPD according to one embodiment of the present disclosure. In this embodiment, the transmitter 72 is a multi-carrier, dual-band system (e.g., a transmitter for a CDMA or Long Term Evolution (LTE) base station). The two bands of the dual-band system are referred to as a lower band (BAND L) and an upper band (BAND U). As illustrated, complex-valued digital baseband input signals for the two bands are generated by corresponding sources 74-1 and 74-2. Bandwidth allocations in each band may be identical or may be different (i.e., a symmetric versus an asymmetric case). The digital baseband input signals are digitally upconverted by a digital upconversion system 76 to thereby provide complex-valued digital RF signals $\tilde{u}_L(n)$ and $\tilde{u}_U(n)$. The digital RF signals $\tilde{u}_L(n)$ and $\tilde{u}_U(n)$ are predistorted, at digital RF, by a RF-DPD system 78 to thereby provide corresponding complex-valued predistorted digital RF signals $\tilde{y}_L(n)$ and $\tilde{y}_u(n)$. The predistorted digital RF signals $\tilde{y}_L(n)$ and $\tilde{y}_U(n)$ are summed by a combiner 80, and a resulting predistorted multi-band digital RF signal is processed by a multi-band signal processing system 82 to provide a predistorted multi-band analog RF signal, which is amplified by a PA 84 to provide a multi-band transmit signal z(n).

More specifically, the digital upconversion system 76 includes a DRF upconversion subsystem 86-1 for the lower band (referred to as DRF-L) and a DRF upconversion subsystem 86-2 for the upper band (referred to as DRF-U). The DRF upconversion subsystem 86-1 for the lower band includes a rate change filter 88-1, a complex baseband (BB) tuner 90-1, an upsampler 92-1, and an image selection filter 94-1. In this embodiment, the rate change filter 88-1 converts a sampling rate of the digital baseband input signal from the source 74-1 to $f_S/N$ prior to complex baseband tuning, where $f_S$ is a sampling rate of a DAC 100 of the multi-band signal processing system 82 (discussed in greater detail below) and N is the up-sampling rate of the upsampler 92-1. Alternatively, a sampling rate of the digital baseband input signal from the source 74-1 for the lower band is $f_S/N$ in which case the rate change filter 88-1 is not needed. Note that if rate conversion is needed, the rate conversion may alternatively be performed elsewhere in the DRF upconversion subsystem 86-1 prior to the DAC 100 (e.g., subsequent to the complex baseband tuner 90-1, subsequent to the upsampler 92-1, subsequent to the image selection filter 94-1, or prior to the DAC 100).

The complex baseband tuner 90-1 performs a complex tuning of the complex digital baseband input signal for the lower band. More specifically, the complex baseband tuner 90-1 tunes the digital baseband input signal for the lower band to a baseband tuning frequency $(f_L)$ to thereby produce a complex tuned digital signal. In one embodiment, the baseband tuning frequency $(f_L)$ is programmable or otherwise selectable within a range of $-f_S/2N$ and $f_S/2N$, where $f_S$ is an effective sampling rate of the DAC 100 and N is an up-sampling rate of the upsampler 92-1. The complex baseband tuner 90-1 is preferably utilized to provide fine tuning to achieve the desired carrier frequency for the corresponding frequency band of the multi-band transmit signal z(n) output by the PA 84. A particular example of a complex baseband tuner is described in U.S. Patent Application Publication No. 2009/0316838 A1 entitled CORDIC BASED COMPLEX TUNER WITH EXACT FREQUENCY RESOLUTION, filed on Jun. 23, 2008 and published on Dec. 24, 2009, which is hereby incorporated herein by reference in its entirety.

The upsampler 92-1 upsamples the complex tuned digital signal output by the complex baseband tuner 90-1 at an up-sampling rate N, where N≥2, to produce an upsampled digital signal having a sampling rate of $f_S$. In the frequency domain, the upsampled digital signal includes N images of the complex tuned digital signal output by the complex baseband tuner 90-1 equally spaced apart in the frequency range of 0 to $f_S$. The upsampler 92-1 is preferably utilized to provide coarse tuning to achieve the desired carrier frequency for the lower band of the multi-band signal. The image selection filter 94-1 filters the upsampled digital signal to select a desired one of the images of the complex tuned digital signal and thereby provide the digital RF signal for the lower band. More specifically, the image selection filter 94-1 is preferably programmable via one or more parameters (e.g., filter coefficients) such that a passband of the image selection filter 94-1 is centered at a desired filter tuning frequency. The filter tuning frequency is selected such that the desired image of the complex tuned digital signal falls within the passband of the image selection filter 94-1. In one embodiment, the center frequency of the digital RF signal is equal to the desired center frequency for the low band in the multi-band transmit signal z(n). However, the center frequency of the digital RF signal is not limited thereto. For instance, the center frequency of the digital RF signal may be such that the desired center frequency of the low band in the multi-band transmit signal z(n) falls in the second or higher Nyquist zone of the DAC 100.

In the same manner, the DRF upconversion subsystem 86-2 includes a rate change filter 88-2, a complex baseband tuner 90-2, an upsampler 92-2, and an image selection filter 94-2. In this embodiment, the rate change filter 88-2 converts a sampling rate of the digital baseband input signal from the source 74-2 to $f_S/N$ prior to complex baseband tuning, where $f_S$ is a sampling rate of the DAC 100 and N is the up-sampling rate of the upsampler 92-2. Alternatively, a sampling rate of the digital baseband input signal from the source 74-2 for the higher band is $f_S/N$ in which case the rate change filter 88-2 is not needed. Note that if rate conversion is needed, the rate conversion may alternatively be performed elsewhere in the DRF upconversion subsystem 86-2 prior to the DAC 100 (e.g., subsequent to the complex baseband tuner 90-2, subsequent to the upsampler 92-2, subsequent to the image selection filter 94-2, or prior to the DAC 100).

The complex baseband tuner 90-2 performs a complex tuning of the digital baseband input signal for the upper band. More specifically, the complex baseband tuner 90-2 tunes the digital baseband input signal for the upper band to a baseband tuning frequency $(f_U)$ to thereby produce a complex tuned digital signal. In one embodiment, the baseband tuning frequency $(f_U)$ is programmable or otherwise selectable within a range of $-f_S/2N$ and $f_S/2N$, where $f_S$ is an effective sampling rate of the DAC 100 and N is an up-sampling rate of the upsampler 92-2. The complex baseband tuner 90-2 is preferably utilized to provide fine tuning to achieve the desired carrier frequency for the corresponding frequency band of the multi-band transmit signal z(n) output by the PA 84. Again, a particular example of a complex baseband tuner is described in U.S. Patent Application Publication No. 2009/0316838 A1.

The upsampler 92-2 upsamples the complex tuned digital signal output by the complex baseband tuner 90-2 at an upsampling rate N, where N≥2, to produce an upsampled digital signal having a sampling rate of $f_S$. In the frequency domain, the upsampled digital signal includes N images of the complex tuned digital signal output by the complex baseband tuner 90-2 equally spaced apart in the frequency range of 0 to $f_S$. The upsampler 92-2 is preferably utilized to provide coarse tuning to achieve the desired carrier frequency for the upper band of the multi-band signal. The image selection filter 94-2 filters the upsampled digital signal to select a desired one of the images of the complex tuned digital signal and thereby provide the digital RF signal for the upper band. More specifically, the image selection filter 94-2 is preferably programmable via one or more parameters (e.g., filter coefficients) such that a passband of the image selection filter 94-2 is centered at a desired filter tuning frequency. The filter tuning frequency is selected such that the desired image of the complex tuned digital signal falls within the passband of the image selection filter 94-2. In one embodiment, the center frequency of the digital RF signal is equal to the desired center frequency for the upper band in the multi-band transmit signal z(n). However, the center frequency of the digital RF signal is not limited thereto. For instance, the center frequency of the digital RF signal may be such that the desired center frequency of the upper band in the multi-band transmit signal z(n) falls in the second or higher Nyquist zone of the DAC 100.

The RF-DPD system 78 includes separate RF-DPD actuators 96-1 and 96-2 for the lower and upper bands, respectively. Using complex-valued weights $\{a_{qm}\}$ for the lower band (not shown), the RF-DPD actuator 96-1 predistorts the digital RF signal for the lower band by generating, or directly synthesizing, self and intra-band distortion products based on the digital RF signal for the lower band and inter-band distortion products (or distortion cross-products) based on both the digital RF signal for the lower band output by the DRF upconversion subsystem 86-1 and the digital RF signal for the upper band output by the DRF upconversion subsystem 86-2. In one preferred embodiment, the self, intra-band, and inter-band distortion products generate the predistorted digital RF signal for the lower band in such a manner as to introduce predistortion that is substantially an inverse of distortion caused by non-linearity of the PA 84 with respect to the lower band.

Equation 4 below is a mathematical representation of the operation of the RF-DPD actuator 96-1 according to one exemplary embodiment of the present disclosure. In general, the RF-DPD actuator 96-1 generates distortion products as desired on system requirements and a frequency plan for the transmitter 72 as well as tradeoffs between which PA distortions are to be mitigated by RF-DPD versus analog filtering.

$$y_L(n) = \sum_{m=0}^{M} a_{1,m} \cdot u_L(n-m) + \sum_{m=0}^{M} a_{3,m} \cdot u_L(n-m) \cdot |u_L(n-m)|^2 +$$

$$\sum_{m=0}^{M} a_{5,m} \cdot u_L(n-m) \cdot |u_L(n-m)|^4 + \sum_{m=0}^{M} b_{3,m} \cdot u_L(n-m) \cdot |u_H(n-m)|^2 +$$

$$\sum_{m=0}^{M} b_{5,m} \cdot u_L(n-m) \cdot |u_L(n-m)|^2 |u_H(n-m)|^2 +$$

$$\sum_{m=0}^{M} c_{5,m} \cdot u_L(n-m) \cdot |u_H(n-m)|^4 +$$

$$\sum_{m=0}^{M} d_{3,m} \cdot u_L(n-m) \cdot u_L(n-m) \cdot u_H^*(n-m) +$$

$$\sum_{m=0}^{M} d_{5,m} \cdot u_L(n-m) \cdot u_L(n-m) \cdot u_H^*(n-m) \cdot |u_L(n-m)|^2 +$$

$$\sum_{m=0}^{M} e_{5,m} \cdot u_L(n-m) \cdot u_L(n-m) \cdot u_H^*(n-m) \cdot |u_H(n-m)|^2$$

where:
- The $\{a_{1,m}\}$ taps produce $1^{st}$ order terms centered at the center frequency of the lower band ($f_L$) to equalize the non-linear PA 84.
- The $\{a_{3,m}\}$ taps produce the $3^{rd}$ order self and intra-band distortion products centered at the center frequency of the lower band ($f_L$).
- The $\{a_{5,m}\}$ taps produce the $5^{th}$ order self and intra-band distortion products centered at the center frequency of the lower band ($f_L$).
- The $\{b_{3,m}\}$ taps produce the $3^{rd}$ order inter-band distortion products centered at the center frequency of the lower band ($f_L$).
- The $\{b_{5,m}\}$ and $\{c_{5,m}\}$ taps produce the $5^{th}$ order inter-band distortion products centered at the center frequency of the lower band ($f_L$).
- The $\{d_{3,m}\}$ taps produce the $3^{rd}$ order inter-band distortion products centered at the lower intermodulation frequency between the two bands (i.e., $2f_L - f_U$).
- The $\{d_{5,m}\}$ and $\{e_{5,m}\}$ taps produce the $5^{th}$ order inter-band distortion products centered at the lower intermodulation frequency between the two bands (i.e., $2f_L - f_U$).

The distortion products shown in Equation 4 represent only a particular example. Additional inter-band products centered at alternative intermodulation frequencies such as, for example, $3f_L - 2f_U$ or others can easily be generated and utilized by the RF-DPD actuator 96-1 using the same approach.

In a similar manner, using complex-valued tap weights $\{a_{qm}\}$ for the upper band (not shown), the RF-DPD actuator 96-2 predistorts the digital RF signal for the upper band by generating, or directly synthesizing, self and intra-band distortion products based on the digital RF signal for the upper band and inter-band distortion products (or distortion cross-products) based on both the digital RF signal for the upper band output by the DRF upconversion subsystem 86-2 and the digital RF signal for the lower band output by the DRF upconversion subsystem 86-1. In one preferred embodiment, the self, intra-band, and inter-band distortion products generate the predistorted digital RF signal for the upper band in such a manner as to introduce predistortion that is substantially an inverse of distortion caused by non-linearity of the PA 84 with respect to the upper band. In one embodiment, the RF-DPD actuator 96-2 for the upper band generates distortion products of the same form as those shown in Equation 4 but with the role of the "L" and "U" signals interchanged (i.e., replace L↔U throughout in Equation 4 and assume an independent set of complex-valued tap weights are used).

The predistorted digital RF signals for the lower and upper bands output by the RF-DPD actuators 96-1 and 96-2, respectively, are summed by the combiner 80 to provide the predistorted multi-band digital RF signal. In the illustrated embodiment, a real-valued predistorted multi-band digital RF signal is obtained by a REAL{•} function 98. The real-valued predistorted multi-band digital RF signal is then D/A converted by the DAC 100 and optionally filtered by an RF filter 102. The resulting predistorted multi-band analog signal is provided to the PA 84 for amplification.

Before proceeding, it should be noted that the REAL{•} function 98 may alternatively be implemented within the RF-DPD system 78 prior to the combiner 80 and the DAC 100. Still further, the need for the including the REAL{•} function 98 may be removed by computing only the real parts of the predistorted digital RF signals in the RF-DPD actuators 96-1 and 96-2 (rather than computing both the real and imaginary parts of the predistorted digital RF signals). Doing so reduces the computational complexity of the RF-DPD system 78 by a factor of 2 and removes the need for the REAL{•} function 98.

The RF-DPD system 78, and in particular the tap weights $\{a_{qm}\}$ of the RF-DPD actuators 96-1 and 96-2, are trained by a training system 104. In general, the training system 104 trains the RF-DPD system 78, and in particular the tap weights $\{a_{qm}\}$ of the DPD actuators 96-1 and 96-2, using a closed-loop training algorithm that employs a transmit, or feedback, observation receiver. In FIG. 5, the training system 104 is based on an "indirect learning" principle where the (delayed) target signals are taken from the RF-DPD actuators 96-1 and 96-2. Alternatively, a "direct" solution may be used where the target signals are taken from the outputs of the DRF upconversion subsystems 86-1 and 86-2. In either case, the tap weights $\{a_{qm}\}$ may be computed using any suitable form of a least squares algorithm or stochastic gradient descent algorithm. For instance, the training system 104 may utilize a least squares algorithm since the predistorted digital RF signals (e.g., those generated according to Equation 4) are linear functions of the corresponding tap weights $\{a_{qm}\}$.

More specifically, in the example illustrated in FIG. 5, an Analog-to-Digital Converter (ADC) 106 is coupled to the output of the PA 84 via a coupler 108. The ADC 106 outputs a multi-band digital RF signal that corresponds to the multiband transmit signal output by the PA 84. The training system 104 includes bandpass filters 110-1 and 110-2 centered at the lower band and the upper band, respectively. For the lower band, the multi-band digital RF signal is filtered by the bandpass filter 110-1 and the resulting filtered digital RF signal for the lower band is translated to baseband by a complex tuner 112-1 and down-sampled by a factor M by a decimation filter 114-1 to provide a digital baseband feedback signal for the lower band. Likewise, for the upper band, the multiband digital RF signal is filtered by the bandpass filter 110-2 and the resulting filtered digital RF signal for the upper band is translated to baseband by a complex tuner 112-2 and then down-sampled by a factor M by a decimation filter 114-2 to provide a digital baseband feedback signal for the upper band. The digital baseband feedback signals for the lower and upper bands are provided to baseband training subsystems 116-1 and 116-2, as illustrated. Thus, there are separate baseband training subsystems 116-1 and 116-2 for the different frequency bands. Note, however, that each baseband training subsystem 116-1 and 116-2 utilizes both of the digital baseband feedback signal for the lower band and the digital baseband feedback signal for the upper band.

In a similar manner, the predistorted digital RF signal output by the RF-DPD actuator 96-1 is translated, or tuned, to baseband by a complex tuner 118-1, down-sampled by a factor M by a decimation filter 120-1, and delayed by a delay 122-1 to provide a delayed baseband equivalent signal for the predistorted digital RF signal output by the RF-DPD actuator 96-1 for the lower band. Likewise, the predistorted digital RF signal output by the RF-DPD actuator 96-2 is translated, or tuned, to baseband by a complex tuner 118-2, down-sampled by a factor M by a decimation filter 120-2, and delayed by a delay 122-2 to provide a delayed baseband equivalent signal for the predistorted digital RF signal output by the RF-DPD actuator 96-2 for the upper band.

The baseband training subsystem 116-1 generates, or directly synthesizes, a baseband equivalent version of the same self, intra-band, and inter-band distortion products generated by the RF-DPD actuator 96-1 based on the digital baseband feedback signal for the lower band and the digital baseband feedback signal for the upper band to thereby output a baseband feedback signal for the lower band. Ideally, the baseband feedback signal for the lower band output of the baseband training subsystem 116-1 is equal to the delayed baseband equivalent signal for the predistorted digital RF signal output by the RF-DPD actuator 96-1 for the lower band. Likewise, the baseband training subsystem 116-2 generates, or directly synthesizes, a baseband equivalent version of the same self, intra-band, and inter-band distortion products generated by the RF-DPD actuator 96-2 based on the digital baseband feedback signal for the upper band and the digital baseband feedback signal for the upper band to thereby output a baseband feedback signal for the upper band. Ideally, the baseband feedback signal for the upper band output of the baseband training subsystem 116-2 is equal to the delayed baseband equivalent signal for the predistorted digital RF signal output by the RF-DPD actuator 96-2 for the lower band.

In operation, a subtractor 124-1 outputs an error signal for the lower band that is equal to a difference between the delayed baseband equivalent signal for the predistorted digital RF signal for the lower band and the baseband feedback signal for the lower band. Based on the error signal from the subtractor 124-1, the baseband training subsystem 116-1 utilizes a suitable training algorithm (e.g., least squares) to adjust tap weights utilized by the baseband training subsystem 116-1 to generate the desired distortion products to minimize the error signal. At some desired point, the tap weights of the baseband training subsystem 116-1 that have been adaptively configured based on the error signal are provided to the RF-DPD actuator 96-1 and thereafter used as the tap weights $\{a_{q,m}\}$ of the RF-DPD actuator 96-1. This process is repeated as desired to adaptively configure the RF-DPD actuator 96-1.

In the same manner, a subtractor 124-2 outputs an error signal for the upper band that is equal to a difference between the delayed baseband equivalent signal for the predistorted digital RF signal for the upper band and the baseband feedback signal for the upper band. Based on the error signal from the subtractor 124-2, the baseband training subsystem 116-2 utilizes a suitable training algorithm (e.g., least squares) to adjust tap weights utilized by the baseband training subsystem 116-2 to generate the desired distortion products to minimize the error signal. At some desired point, the tap weights of the baseband training subsystem 116-2 that have been adaptively configured based on the error signal are provided to the RF-DPD actuator 96-2 and thereafter used as the tap weights $\{a_{qm}\}$ of the RF-DPD actuator 96-2. This process is repeated as desired to adaptively configure the RF-DPD actuator 96-2.

Note that the training procedure performed by the training system 104 computes the two sets of complex-valued tap weights $\{a_{qm}\}$ for the RF-DPD actuators 96-1 and 96-2, respectively, independently from one common dual-band input signal obtained from a TOR. The fact that the training procedure for each band may be performed independently provides the following computation advantage. Typically the computational complexity of the least squares procedure is $O(N^3)$ for N total tap weights. With B separate bands and assuming $N_B$ tap weights per band, it follows the training procedure has a complexity of $B \times O(N_B^3)$ whereas a general least squares procedure would be $O((B-N_B)^3)$.

Figure 6:
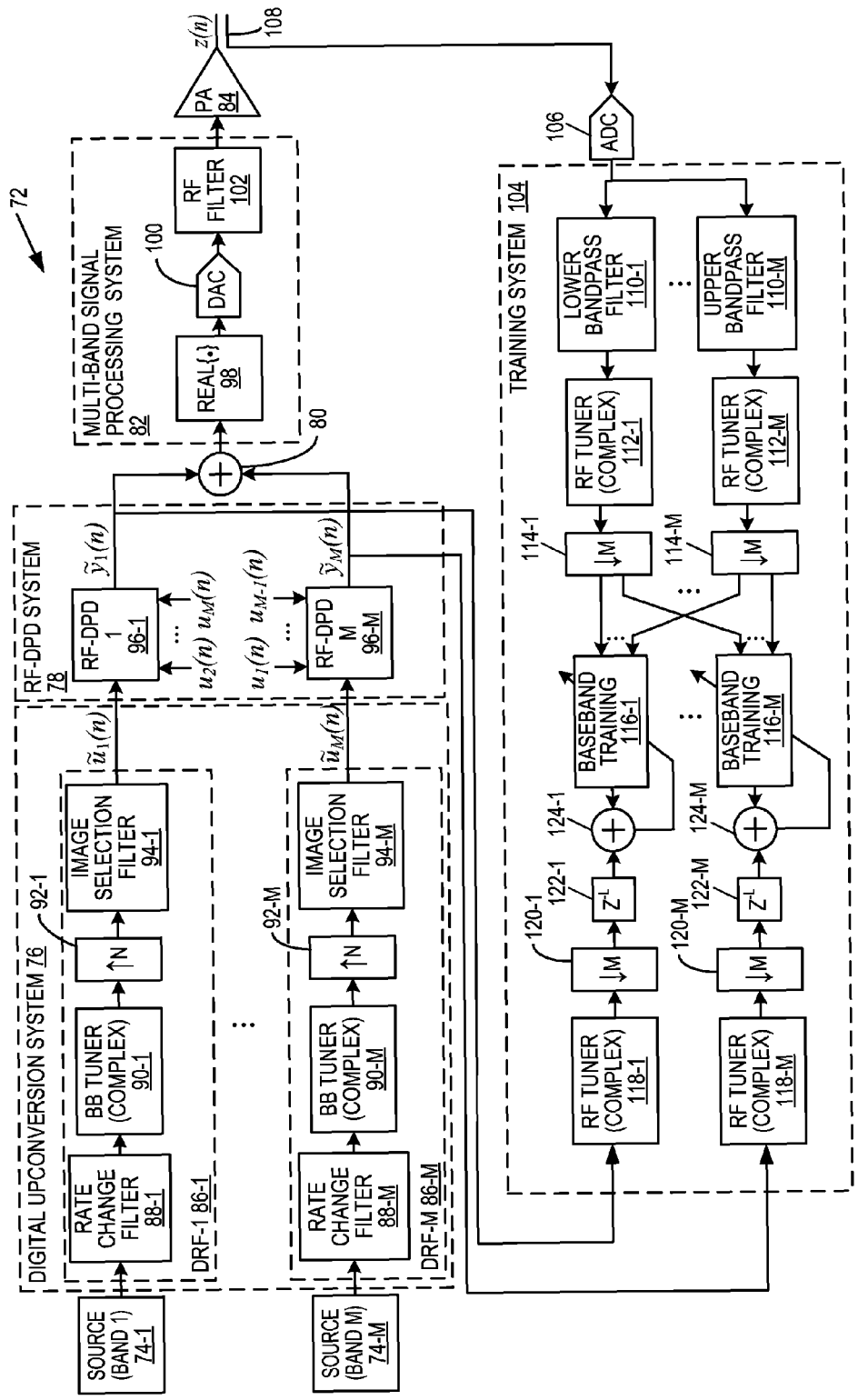
FIG. 6 illustrates a more general multi-band transmitter including RF-DPD according to one embodiment of the present disclosure.

FIG. 6 illustrates an embodiment of the transmitter 72 of FIG. 5 that has been generalized for any multi-band signal having any number (M) of bands (M≥2) whereas the embodiment of FIG. 5 is for a dual-band scenario. Thus, the digital upconversion system 76 includes separate DRF upconversion subsystems 86-1 through 86-M for the M bands, the RF-DPD system 78 includes separate RF-DPD actuators 96-1 through 96-M for the M bands, and the training system 104 includes separate bandpass filters 110-1 through 110-M, complex tuners 112-1 through 112-M, decimation filters 114-1 through 114-M, baseband training subsystems 116-1 through 116-M, complex tuners 118-1 through 118-M, decimation filters 120-1 through 120-M, delays 122-1 through 122-M, and subtractors 124-1 through 124-M for the M bands. Otherwise, the details of the transmitter 72 are the same as described above. As such, the details are not repeated.

Figure 7:
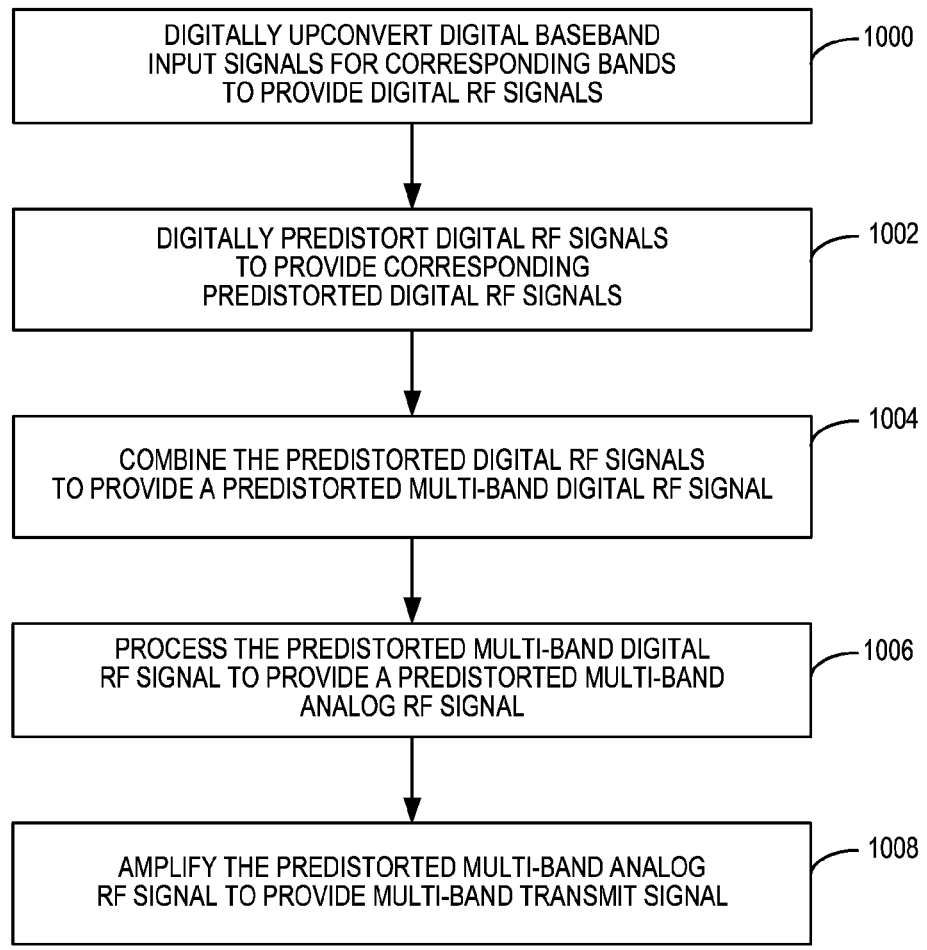
FIG. 7 is a flow chart that illustrates the operation of the multi-band transmitter of FIG. 6 according to one embodiment of the present disclosure.

FIG. 7 is a flow chart that illustrates the operation of the dual-band embodiment of the transmitter 72 of FIG. 5 and, more generally, the operation of the multi-band embodiment of the transmitter 72 of FIG. 6 to generate and transmit the multi-band transmit signal according to one embodiment of the present disclosure. First, the digital upconversion system 76, and more specifically the DRF upconversion subsystems 86-1 through 86-M, digitally upconverts the digital baseband input signals for corresponding bands to thereby provide the digital RF signals (step 1000). Next, the RF-DPD system 78, and in particular the RF-DPD actuators 96-1 through 96-M, digitally predistorts the digital RF signals to provide the corresponding predistorted digital RF signals (step 1002). The combiner 80 then combines, or sums, the predistorted digital RF signals to provide the predistorted multi-band digital RF signal (step 1004). The multi-band signal processing system 82 then processes the predistorted multi-band digital RF signal to provide the corresponding predistorted multi-band analog RF signal (step 1006). Lastly, the PA 84 amplifies the predistorted multi-band analog RF signal to provide the multi-band transmit signal (step 1008).

Figure 8:
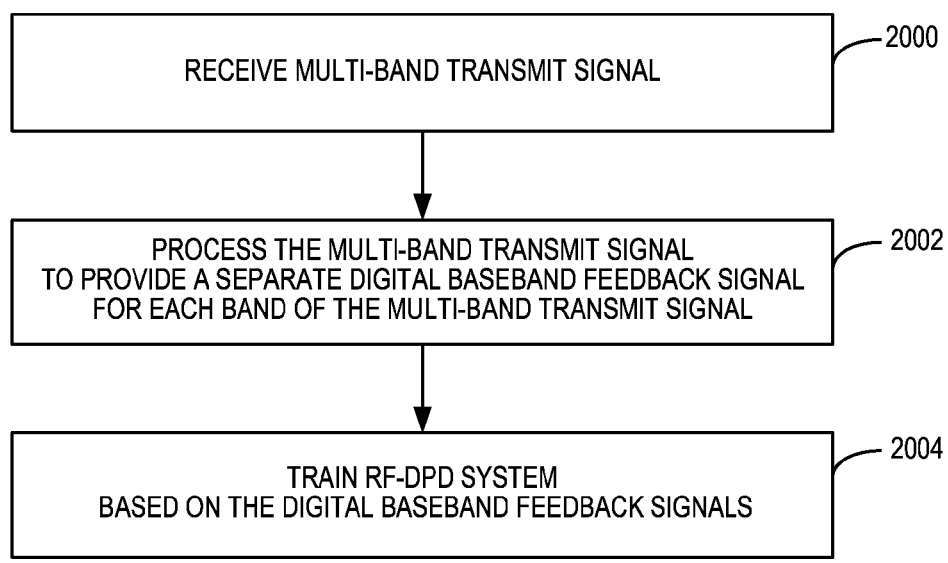
FIG. 8 is a flow chart that illustrates the operation of the training system of FIG. 6 according to one embodiment of the present disclosure.

FIG. 8 is a flow chart that illustrates the operation of transmitter 72 of FIGS. 5 and 6 to train the RF-DPD system 78 according to one embodiment of the present disclosure. In this embodiment, the ADC 106 receives the multi-band transmit signal from the output of the PA 84 via the coupler 108 (step 2000). The ADC 106, the bandpass filters 110-1 through 110-M, the complex tuners 112-1 through 112-M, and the decimation filters 114-1 through 114-M then process the multi-band transmit signal to provide a separate single-band digital baseband feedback signal for each band of the multi-band transmit signal (step 2002). Lastly, the training subsystems 112-1 through 112-M train the RF-DPD system 78, and in particular the tap weights $\{a_{qm}\}$ of the corresponding RF-DPD actuators 96-1 through 96-M, based on the digital baseband feedback signals for the different bands, as discussed above (step 2004).

While the systems and methods for implementing RF-DPD discussed herein are not limited to any particular advantages, some exemplary advantages are provided below. Note, however, that the concepts disclosed and claimed herein are not limited to any of these advantages. First, for multi-band signals with several disjoint bands, moving the DPD function from baseband to RF reduces the sampling rate requirements of the DRF upconversion data paths (i.e., the data paths through the DRF upconversion subsystems 86-1 through 86-M) because the DRF upconversion data paths operate on undistorted digital baseband signals, which have a 3×, 5×, or more reduction in bandwidth as compared to the predistorted digital baseband signals when BB-DPD is used. This reduction in sampling rate leads to a significant reduction in computational complexity.

Second, for multi-band signals with several disjoint bands or large frequency separation between those bands, moving the DPD function from baseband to RF results in fewer DRF upconversion data paths (i.e., fewer DRF upconversion subsystems 86) since low-bandwidth DRF data paths may be allocated to (undistorted) signal bands rather than to (distorted) products of signals originating from multiple bands. The distinct number of distortion products between bands grows rapidly and quickly exceeds the number of bands, as that number of bands increases. In other words, for RF-DPD, no additional DRF upconversion data paths are needed to upconvert inter-band distortion products, as is needed with BB-DPD.

Third, the RF-DPD actuators 96-1 through 96-M separately and explicitly synthesize the desired intra-band and inter-band distortion products. One advantage to maintaining separate RF-DPD actuators 96-1 through 96-M is that each complex-valued tap weight may incorporate an independent rotation to cancel an unknown carrier phase inherent in the corresponding distortion product at RF. The tap weight adaptation performed by the corresponding training subsystems 112-1 through 112-M solves for these rotations implicitly.

Fourth, as compared to BB-DPD, RF-DPD provides greater flexibility in selecting specific distortion products for digital predistortion versus using analog filtering since the number of DRF data paths is generally independent of the suite of selected distortion products. In essence, the RF-DPD architecture provides better scalability for multi-band signals. Lastly, a least squares training procedure for RF-DPD has less complexity for multi-band signals than for an equivalent solution implemented at baseband since the tap weights for each band may be optimized independently. Finally, it should be noted that although the complexity of the RF-DPD actuators 96-1 through 96-M is greater than corresponding BB-DPD actuators (due to the higher sampling rate of the former), the savings achieved in the digital upconversion system 76 through fewer branches and lower sampling rates in each branch makes RF-DPD preferable, especially for multi-band signals with several disjoint bands or with large separations between bands.

The following acronyms are used throughout this disclosure.

| | |
|---|---|
| ADC | Analog-to-Digital Converter |
| BB | Baseband |
| BB-DPD | Baseband Digital Predistortion |
| CDMA | Code Division Multiple Access |
| D/A | Digital-to-Analog |
| DAC | Digital-to-Analog Converter |
| DRF | Digital Radio Frequency |
| DSP | Digital Signal Processing |
| IF | Intermediate Frequency |
| LTE | Long Term Evolution |
| MHz | Megahertz |
| MP | Memory Polynomial |
| OFDM | Orthogonal Frequency Duplex Multiplexing |
| PA | Power Amplifier |

-continued

| | |
|---|---|
| RF | Radio Frequency |
| RF-APD | Radio Frequency Analog Predistortion |
| RF-DPD | Radio Frequency Digital Predistortion |
| TOR | Transmit Observation Receiver |

Those skilled in the art will recognize improvements and modifications to the preferred embodiments of the present disclosure. All such improvements and modifications are considered within the scope of the concepts disclosed herein and the claims that follow.

What is claimed is:

1. A multi-band transmitter, comprising:
a digital upconversion system configured to digitally upconvert a plurality of digital input signals to provide a plurality of digital radio frequency signals, each digital input signal of the plurality of digital input signals and thus each digital radio frequency signal of the plurality of digital radio frequency signals corresponding to a different band of a plurality of bands of a multi-band transmit signal to be transmitted by the multi-band transmitter;
a radio frequency digital predistortion system configured to digitally predistort the plurality of digital radio frequency signals to provide a plurality of predistorted digital radio frequency signals, wherein the radio frequency digital predistortion system directly synthesizes intra-band and inter-band distortion products; and
combiner circuitry configured to combine the plurality of predistorted digital radio frequency signals to provide a multi-band predistorted digital radio frequency signal.

2. The multi-band transmitter of claim 1 further comprising:
a multi-band signal processing system configured to process the multi-band predistorted digital radio frequency signal to provide a multi-band predistorted analog radio frequency signal; and
power amplifier circuitry configured to amplify the multi-band predistorted analog radio frequency signal to provide the multi-band transmit signal.

3. The multi-band transmitter of claim 2 wherein the multi-band predistorted digital radio frequency signal is a complex signal, and the multi-band signal processing system comprises:
circuitry configured to receive the multi-band predistorted digital radio frequency signal and output a real part of the multi-band predistorted digital radio frequency signal;
digital-to-analog conversion circuitry configured to convert the real part of the multi-band predistorted digital radio frequency signal from digital to analog and output a corresponding analog signal; and
filtering circuitry configured to filter the analog signal output by the digital-to-analog conversion circuitry to thereby provide the multi-band predistorted analog radio frequency signal.

4. The multi-band transmitter of claim 2 wherein the multi-band predistorted digital radio frequency signal is a real signal, and the multi-band signal processing system comprises:
digital-to-analog conversion circuitry configured to convert the multi-band predistorted digital radio frequency signal from digital to analog and output a corresponding analog signal; and
filtering circuitry configured to filter the analog signal output by the digital-to-analog conversion circuitry to thereby provide the multi-band predistorted analog radio frequency signal.

5. The multi-band transmitter of claim 1 wherein the digital upconversion system comprises a separate digital upconversion subsystem for each band of the multi-band transmit signal to be transmitted by the multi-band transmitter.

6. The multi-band transmitter of claim 5 wherein, for each band of the multi-band transmit signal, the separate digital upconversion subsystem for the band of the multi-band transmit signal comprises:
complex baseband tuning circuitry configured to perform complex tuning of the digital input signal for the band to a desired baseband tuning frequency to thereby provide a complex tuned digital signal;
up-sampling circuitry configured to upsample the complex tuned digital signal to a desired up-sampling rate to thereby provide an upsampled digital signal; and
image selection filtering circuitry configured to filter the upsampled digital signal to select a desired image of the complex tuned digital signal and thereby provide the digital radio frequency signal for the band of the multi-band transmit signal.

7. The multi-band transmitter of claim 6 wherein, for each band of the multi-band transmit signal, the separate digital upconversion subsystem for the band of the multi-band transmit signal further comprises a rate change filter.

8. The multi-band transmitter of claim 5 wherein the radio frequency digital predistortion system comprises a separate radio frequency digital predistortion subsystem for each band of the multi-band transmit signal to be transmitted by the multi-band transmitter.

9. The multi-band transmitter of claim 8 wherein, for each band of the multi-band transmit signal, the separate radio frequency digital predistortion subsystem for the band of the multi-band transmit signal is configured to:
directly synthesize desired self, intra-band, and inter-band distortion products for the band based on the plurality of digital radio frequency signals to thereby provide a corresponding one of the plurality of predistorted digital radio frequency signals.

10. The multi-band transmitter of claim 8 further comprising a training system configured to train the radio frequency digital predistortion system.

11. The multi-band transmitter of claim 10 wherein the training system comprises a separate training subsystem for each band of the multi-band transmit signal.

12. A method of operation of a multi-band transmitter, comprising:
digitally upconverting a plurality of digital input signals to provide a plurality of digital radio frequency signals, each digital input signal of the plurality of digital input signals and thus each digital radio frequency signal of the plurality of digital radio frequency signals corresponding to a different band of a plurality of bands of a multi-band transmit signal to be transmitted by the multi-band transmitter;
digitally predistorting the plurality of digital radio frequency signals to provide a plurality of predistorted digital radio frequency signals, wherein digitally predistorting the plurality of digital radio frequency signals comprises directly synthesizing intra-band and inter-band distortion products; and
combining the plurality of predistorted digital radio frequency signals to provide a multi-band predistorted digital radio frequency signal.

13. The method of claim 12 further comprising:
processing the multi-band predistorted digital radio frequency signal to provide a multi-band predistorted analog radio frequency signal; and
amplifying the multi-band predistorted analog radio frequency signal to provide the multi-band transmit signal.

14. The method of claim 13 wherein the multi-band predistorted digital radio frequency signal is a real signal, and processing the multi-band predistorted digital radio frequency signal comprises:
converting the multi-band predistorted digital radio frequency signal from digital to analog to thereby provide a corresponding analog signal; and
filtering the corresponding analog signal to thereby provide the multi-band predistorted analog radio frequency signal.

15. The method of claim 13 wherein the multi-band predistorted digital radio frequency signal is a complex signal, and processing the multi-band predistorted digital radio frequency signal comprises:
obtaining a real part of the multi-band predistorted digital radio frequency signal;
converting the real part of the multi-band predistorted digital radio frequency signal from digital to analog to thereby provide a corresponding analog signal; and
filtering the corresponding analog signal to thereby provide the multi-band predistorted analog radio frequency signal.

16. The method of claim 12 wherein digitally upconverting the plurality of digital input signals comprises separately digitally upconverting the plurality of digital input signals for each band of the multi-band transmit signal to be transmitted by the multi-band transmitter.

17. The method of claim 16 wherein separately digitally upconverting the plurality of digital input signals comprises, for each band of the multi-band transmit signal:
performing complex tuning of the digital input signal for the band to a desired baseband tuning frequency to thereby provide a complex tuned digital signal;
up-sampling the complex tuned digital signal to a desired up-sampling rate to thereby provide an upsampled digital signal; and
filtering the upsampled digital signal to select a desired image of the complex tuned digital signal and thereby provide the digital radio frequency signal for the band of the multi-band transmit signal.

18. The method of claim 17 wherein separately digitally upconverting the plurality of digital input signals further comprises, for each band of the multi-band transmit signal, changing a sampling rate of one of a group consisting of: the digital input signal, the upsampled digital signal, and the digital radio frequency signal for the band of the multi-band transmit signal.

19. The method of claim 16 wherein digitally predistorting the plurality of digital radio frequency signals comprises separately digitally predistorting the plurality of digital radio frequency signals for each band of the multi-band transmit signal to be transmitted by the multi-band transmitter.

20. The method of claim 19 wherein separately digitally predistorting the plurality of digital radio frequency signals comprises, for each band of the multi-band transmit signal:
directly synthesizing desired self, intra-band, and inter-band distortion products for the band based on the plurality of digital radio frequency signals to thereby provide a corresponding one of the plurality of predistorted digital radio frequency signals.

21. The method of claim 19 further comprising training models utilized for digitally predistorting the plurality of digital radio frequency signals.

22. The method of claim 21 wherein training the models utilized for digitally predistorting the plurality of digital radio frequency signals comprises separately training the models for corresponding bands of the multi-band transmit signal.

\* \* \* \* \*

UNITED STATES PATENT AND TRADEMARK OFFICE
CERTIFICATE OF CORRECTION

PATENT NO. : 8,948,301 B2
APPLICATION NO. : 13/902023
DATED : February 3, 2015
INVENTOR(S) : Rollins Page 1 of 1

It is certified that error appears in the above-identified patent and that said Letters Patent is hereby corrected as shown below:

Specification

In Column 2, Line 64, delete "transmitter % in" and insert -- transmitter. In --, therefor.

In Column 3, Line 9, delete "in," and insert -- in --, therefor.

In Column 3, Line 10, delete "configured," and insert -- configured --, therefor.

In Column 4, Lines 11-12, delete "DRAWING FIGURES" and insert -- DRAWINGS/FIGURES --, therefor.

In Column 4, Line 14, delete "drawing figures" and insert -- drawings/figures --, therefor.

In Column 4, Line 21, delete "respectively." and insert -- respectively; --, therefor.

In Column 5, Line 67, delete "$\omega_Q+\Delta_S$." and insert -- $\omega_O+\Delta_S$. --, therefor.

In Column 6, Line 10, delete "$s_b$" and insert -- $S_b$ --, therefor.

In Column 7, Line 5, delete "$\tilde{u}(n)$," and insert -- $\tilde{u}(n))$, --, therefor.

In Column 7, Line 39, delete "$\tilde{u}(n)$" and insert -- $\tilde{u}(n)$, --, therefor.

In Column 9, Line 16, delete "RE-DPD" and insert -- RF-DPD --, therefor.

In Column 9, Line 67, delete "-$f_s/2N$ and $f_s/2N$," and insert -- -$f_s/2N$ and $f_s/2N$, --, therefor.

In Column 10, Line 49, delete "$f_s/N$" and insert -- - $f_s/N$ --, therefor.

In Column 12, Line 20, delete "$\{a_{3,m,}\}$" and insert -- - $\{a_{3,m}\}$ --, therefor.

In Column 12, Line 23, delete "$\{a_{5,m,}\}$" and insert -- - $\{a_{5,m}\}$ --, therefor.

In Column 14, Line 43, delete "$\{a_{q,m}\}$" and insert -- - $\{a_{qm}\}$ --, therefor.

Signed and Sealed this
Twenty-third Day of August, 2016

Michelle K. Lee
*Director of the United States Patent and Trademark Office*